United States Patent
Kwak et al.

(10) Patent No.: US 7,990,496 B2
(45) Date of Patent: Aug. 2, 2011

(54) PIXEL STRUCTURE FOR FLAT PANEL DISPLAY APPARATUS

(75) Inventors: Youngshin Kwak, Suwon-si (KR); Heuikeun Choh, Seongnam-si (KR); Peter Bodrogi, Veszprem (HU); Laszlo Czuni, Balatonalmadl (HU); Balazs Kranicz, Veszprem (HU)

(73) Assignee: Samsung Electronics Co., Ltd., Suwon-si (KR)

(*) Notice: Subject to any disclaimer, the term of this patent is extended or adjusted under 35 U.S.C. 154(b) by 738 days.

(21) Appl. No.: 11/186,757

(22) Filed: Jul. 22, 2005

(65) Prior Publication Data

US 2006/0290870 A1   Dec. 28, 2006

(30) Foreign Application Priority Data

Jul. 23, 2004   (KR) .................. 10-2004-0057818

(51) Int. Cl.
*G02F 1/1335* (2006.01)
(52) U.S. Cl. .................................................. 349/106
(58) Field of Classification Search .......... 349/106–109, 349/146
See application file for complete search history.

(56) References Cited

U.S. PATENT DOCUMENTS

| | | | |
|---|---|---|---|
| 5,311,337 A | | 5/1994 | McCartney, Jr. |
| 5,805,136 A | | 9/1998 | Silverbrook et al. |
| 6,067,143 A | * | 5/2000 | Tomita .......................... 349/143 |
| 6,989,876 B2 | * | 1/2006 | Song et al. .................... 349/109 |
| 7,042,537 B2 | * | 5/2006 | Kanazawa et al. ............ 349/106 |
| 2001/0031405 A1 | * | 10/2001 | Phillips ............................. 430/7 |
| 2004/0095521 A1 | | 5/2004 | Song et al. |

FOREIGN PATENT DOCUMENTS

| | | |
|---|---|---|
| CN | 2504659 | 8/2002 |
| JP | 9-251160 | 9/1997 |
| JP | 10-256604 | 9/1998 |
| JP | 2003-149624 | 5/2003 |
| JP | 2004-78218 | 3/2004 |
| KR | 10-2001-0048251 | 6/2001 |

OTHER PUBLICATIONS

Chinese Office Action for corresponding Chinese Patent Application No. 2005100851387 dated May 23, 2008 (6 pgs).
Japanese Office Action issued Jan. 4, 2011 in corresponding Japanese Patent Application 2005-212201.

* cited by examiner

*Primary Examiner* — James A Dudek
(74) *Attorney, Agent, or Firm* — Staas & Halsey LLP

(57) ABSTRACT

A pixel structure for a flat panel display apparatus displaying images using a plurality of pixels, each of the pixels including six or more sub-pixels. The flat panel display apparatus including the pixel structure is free from a color fringe error, and the pixel can include three or more primary colors. Thus, a color representation range of the flat panel display apparatus can be widened. In addition, since the sub-pixels of the pixel can be controlled by sub-pixel rendering, a resolution of the apparatus can be improved. Moreover, high resolution can be obtained in every direction on the display due to superior rotational symmetry of the pixels.

14 Claims, 5 Drawing Sheets

PIXEL STRUCTURE FOR FLAT PANEL DISPLAY APPARATUS

CROSS-REFERENCE TO RELATED APPLICATION

This application claims the priority of Korean Patent Application No. 2004-0057818, filed on Jul. 23, 2004, in the Korean Intellectual Property Office, the disclosure of which is incorporated herein by reference.

BACKGROUND OF THE INVENTION

1. Field of the Invention

The present invention relates to a flat panel display apparatus, and more particularly, to a pixel structure for a flat panel display apparatus.

2. Description of Related Art

Sub-pixel rendering is a technique for displaying images by directly and independently controlling red (R), green (G), and blue (B) sub-pixels forming a pixel. When sub-pixel rendering is used to drive a flat panel display apparatus, spatial resolution of the flat panel display apparatus can be improved.

However, when the sub-pixel rendering technique is used to drive the flat panel display apparatus, a color fringe error may appear. This error is caused by the pixel structure of the display apparatus, and thus, various pixel structures have been introduced in order to solve this problem.

FIGS. 1 through 3 illustrate examples of conventional pixel structures for flat panel display apparatuses.

FIG. 1 shows a pixel structure that is widely used presently. One pixel 10 includes respective R, G, and B sub-pixels 10r, 10g, and 10b in a stripe pattern. The R, G, and B sub-pixels 10r, 10g, and 10b are connected to the sub-pixels of a neighboring pixel in a longitudinal direction to form an R line 12, a G line 14, and a B line 16. Thus, much finer lines than those obtained when using the entire pixel can be represented since each of the stripes has narrow widths when the sub-pixel rendering technique is applied. However, white color or gray color cannot be represented by the each line. Therefore, a flat panel display apparatus having the pixel structure of FIG. 1 is not free from the color fringe error.

FIG. 2 illustrates a pixel structure in PenTile Matrix arrangement.

Referring to FIG. 2, a first thin stripe S1 that is slanted at 45° angle represents cyan color, and cannot represent white color or gray color. In addition, a second thin stripe S2 that is slanted at 45° angle represents magenta color, and cannot represent white color or gray color. Therefore, the color fringe error may appear in a flat panel display apparatus having the pixel structure of FIG. 2.

In FIG. 2, reference numerals 20R, 20G, and 20B denote R, G, and B sub-pixels, respectively.

FIG. 3 illustrates a pixel structure in a hexagonal dot pattern disclosed in U.S. Pat. No. 5,311,337.

Referring to FIG. 3, the pixel structure includes only three primary colors 35, 45, and 55, and thus, a flat panel display apparatus having this pixel structure cannot be used as a multi-channel display with three or more channels for widening the color range.

Consequently, this flat panel display apparatus also is not free from the color fringe error, and is not considered as the multi-channel display.

BRIEF SUMMARY

An aspect of the present invention provides a pixel structure for a flat panel display apparatus, such that the flat panel display apparatus is free from a color fringe error and can be used as a multi-channel display.

According to an aspect of the present invention, there is provided a pixel structure for a flat panel display apparatus displaying images using a plurality of pixels, each of the pixels including six or more sub-pixels.

The pixels may be formed as hexagons, and the sub-pixels may be formed as triangles.

A first pixel selected from the plurality of pixels and a second pixel adjacent to the first pixel may be formed in a rotational symmetric structure. The first pixel and the second pixel may have a rotational symmetry of 60°.

Each of the six sub-pixels may represent one of three primary colors, and the six sub-pixels may be arranged so that the color represented by the first sub-pixel is different from the color represented by the second sub-pixel adjacent to the first sub-pixel.

The first pixel selected from the plurality of pixels may have the same sub-pixel structure as a second pixel adjacent to the first pixel. In this case, the six sub-pixels may represent different colors from each other.

Each of the plurality of pixels may include seven sub-pixels. Here, each of the seven sub-pixels may be formed as hexagons, and the seven sub-pixels may be arranged so that six sub-pixels surround the remaining one sub-pixel.

In addition, the seven sub-pixels may represent different colors from each other.

According to another aspect of the present invention, there is provided a flat panel display displaying images using a plurality of pixels, comprising a pixel structure in which each of the pixels comprises six or more sub-pixels.

Additional and/or other aspects and advantages of the present invention will be set forth in part in the description which follows and, in part, will be obvious from the description, or may be learned by practice of the invention.

BRIEF DESCRIPTION OF THE DRAWINGS

The above and/or other aspects and advantages of the present invention will become apparent and more readily appreciated from the following detailed description, taken in conjunction with the accompanying drawings of which.

DETAILED DESCRIPTION OF EMBODIMENTS

Figure 1:
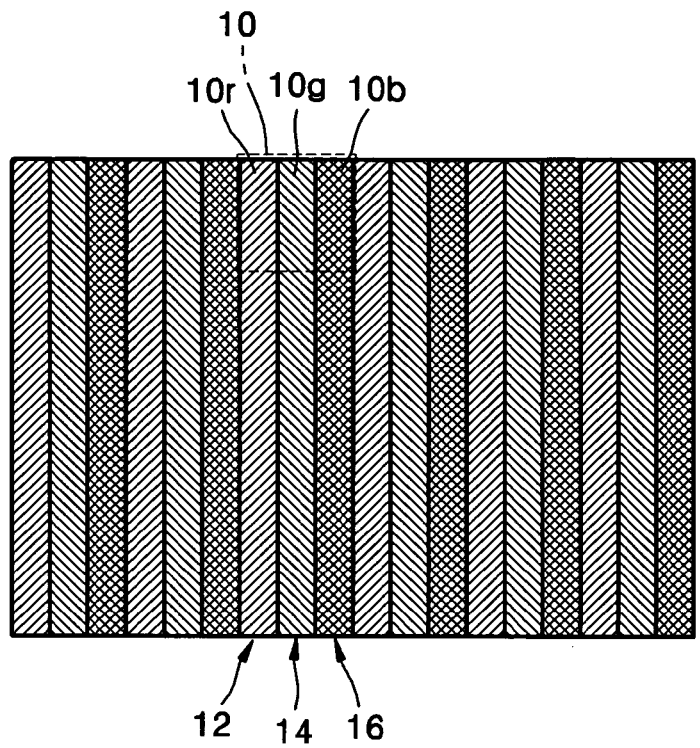
FIGS. 1 through 3 illustrate examples of conventional pixel structures for flat panel display apparatuses.
Figure 2:
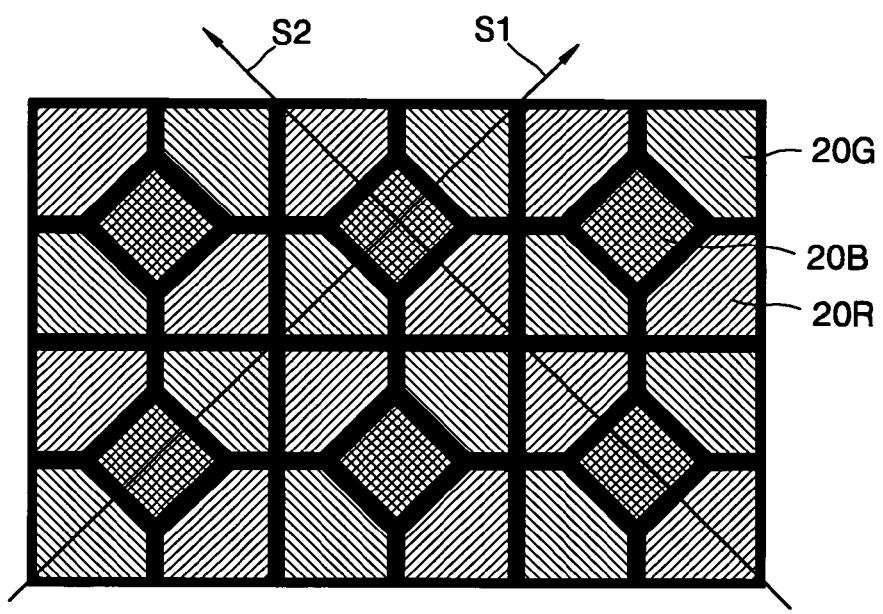
Figure 3:
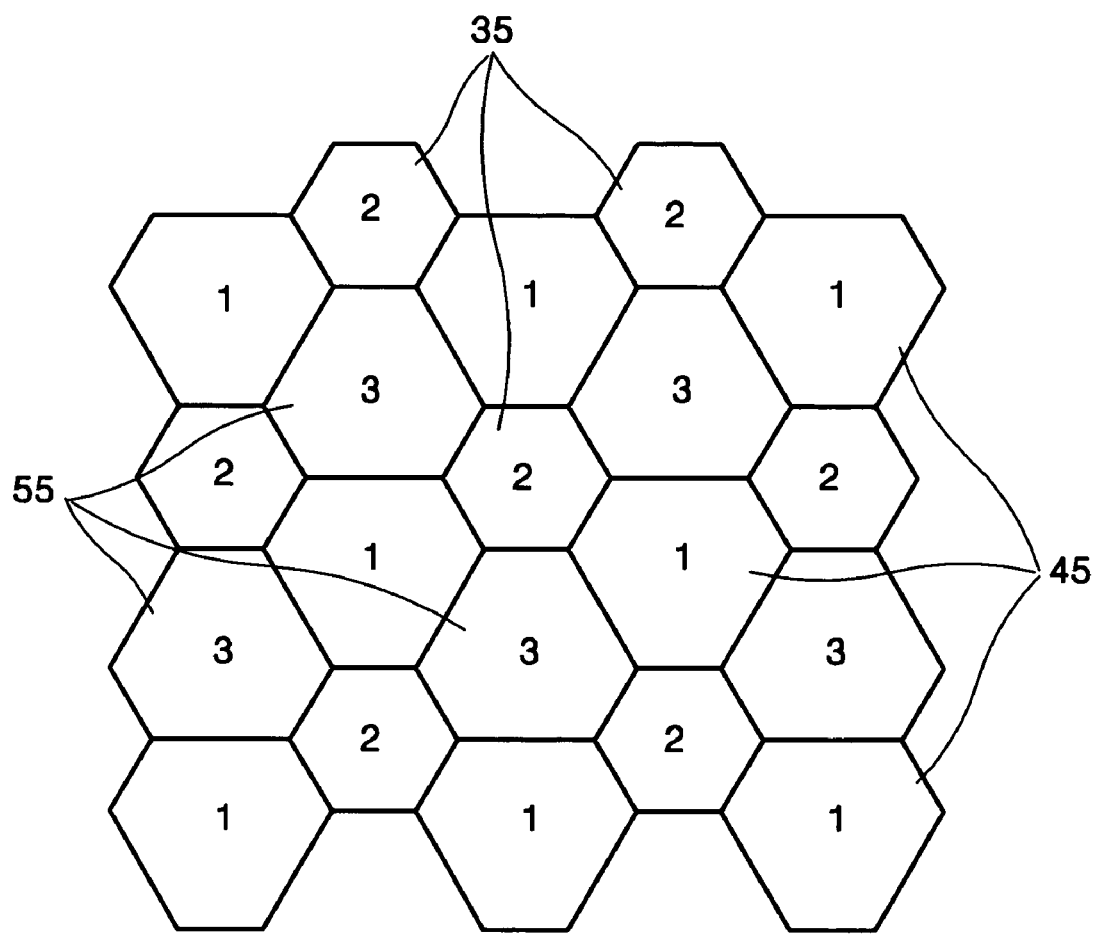

Reference will now be made in detail to embodiments of the present invention, examples of which are illustrated in the accompanying drawings, wherein like reference numerals refer to the like elements throughout. The embodiments are described below in order to explain the present invention by referring to the figures.

Embodiment 1

Figure 4:
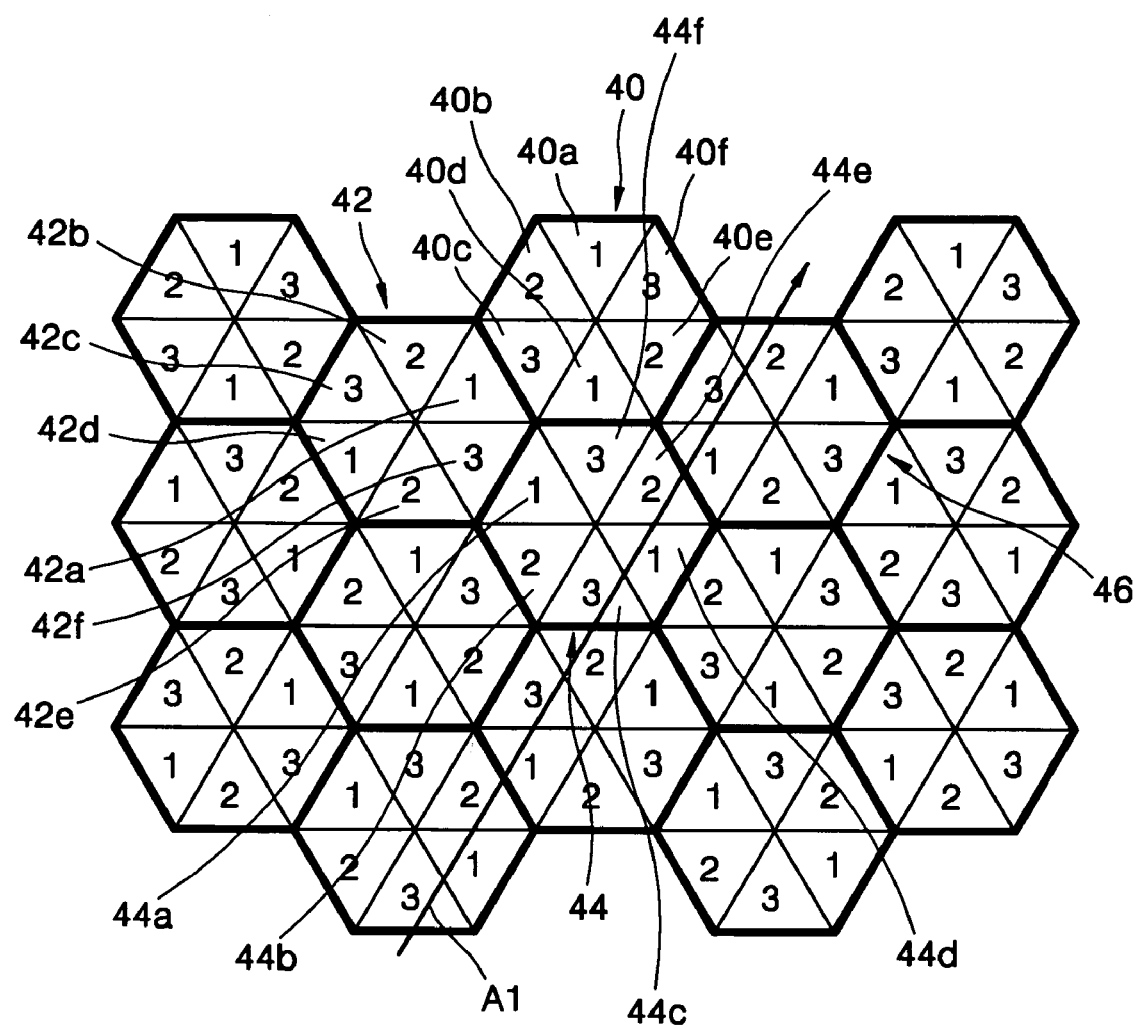
FIGS. 4 through 6 illustrate pixel structures for flat panel display according to respective first through third embodiments of the present invention.

FIG. 4 shows a pixel structure according to a first embodiment of the present invention. In FIG. 4, reference numeral 40 denotes a first pixel representing a minimum unit of an image.

Referring to FIG. 4, structure of the first pixel 40 is a hexagon, and includes respective first through sixth sub-pixels 40a, 40b, 40c, 40d, 40e, and 40f. The first through third sub-pixels 40a, 40b, and 40c represent the red color (R), green color (G), and blue color (B), respectively, and the fourth through sixth sub-pixels 40d, 40e, and 40f also represent the R, G, and B colors, respectively. That is, the first pixel 40 includes two sets of three sub-pixels representing the R, G, and B colors, which are arranged in a counter-clockwise direction.

A second pixel 42 adjacent to the first pixel 40 at a left side of the first pixel 40 has the same structure as the first pixel 40. Accordingly, first through sixth sub-pixels 42a, 42b, 42c, 42d, 42e, and 42f forming the second pixel 42 are also arranged in a counter-clockwise direction like the sub-pixels 40a, 40b, 40c, 40d, 40e, and 40f of the first pixel 40. However, the second pixel 42 may be the same as the first pixel 40 rotated clockwise by 60°. Accordingly, the positions of the first through sixth sub-pixels 42a, 42b, 42c, 42d, 42e, and 42f of the second pixel 42 are different from the positions of the first through sixth sub-pixels 40a, 40b, 40c, 40d, 40e, and 40f of the first pixel 40.

That is, the first and fourth sub-pixels 40a and 40d representing the R color in the first pixel 40 are arranged in a vertical direction, and the second and fifth sub-pixels 40b and 40e representing G color are arranged in an inclined direction at an angle of 60° in a counter-clockwise direction with respect to the vertical direction. However, in the second pixel 42, the sub-pixels 42b and 42e representing the G color are arranged in the vertical direction and the sub-pixels 42a and 42d representing the R color are arranged in an inclined direction at an angle of 60° in a clockwise direction with respect to the vertical direction.

Third and fourth pixels 44 and 46 adjacent to the first pixel 40 are the same as the first pixel 40 rotated by 60°. The third pixel 44 may be the same as the first pixel 40 rotated in the counter-clockwise direction, and the fourth pixel 46 may be the same as the first pixel 40 rotated in the clockwise direction.

As described above, the pixels arranged around the first pixel 40 are the same as the first pixel 40 rotated in clockwise or counter-clockwise direction by 60° angle. That is, the first pixel 40 and the adjacent pixels are in rotational symmetric relations with each other.

As such each of the first through sixth sub-pixels 40a, 40b, 40c, 40d, 40e, and 40f of the first pixel 40 and the corresponding sub-pixels of each of the adjacent pixels 42, 44, and 46 contacting the first pixel 40 do not represent the same color. The above fact can be shown in the sub-pixels around the first pixel 40.

For example, the third sub-pixel 40c representing the B color of the first pixel 40 is adjacent to the first sub-pixel 42a representing the R color of the second pixel 42. In addition, the fourth sub-pixel 40d representing the R color of the first pixel 40 is adjacent to the sixth sub-pixel 44f representing the B color among the six sub-pixels 44a, 44b, 44c, 44d, 44e, and 44f of the third pixel 44.

In addition, the adjacent sub-pixels arranged in a certain direction, for example, along a slant line A1 in FIG. 4 represent different colors from each other, and R, G, and B colors (In FIG. 1 reference numerals 1, 2, and 3 represent R, G, and B respectively) are arranged alternately.

Accordingly, in a flat panel display apparatus having the pixel structure of FIG. 4, the white or gray color can be represented in any direction on the display, and the sub-pixels are arranged not to represent the same color as that of the adjacent sub-pixels. Thus, the color fringe error is not generated.

Embodiment 2

In the pixel structure according to the second embodiment, each pixel is formed as a hexagon like in the pixel structure according to the first embodiment, however, the pixel includes more primary colors than that of the pixel in the first embodiment.

Figure 5:
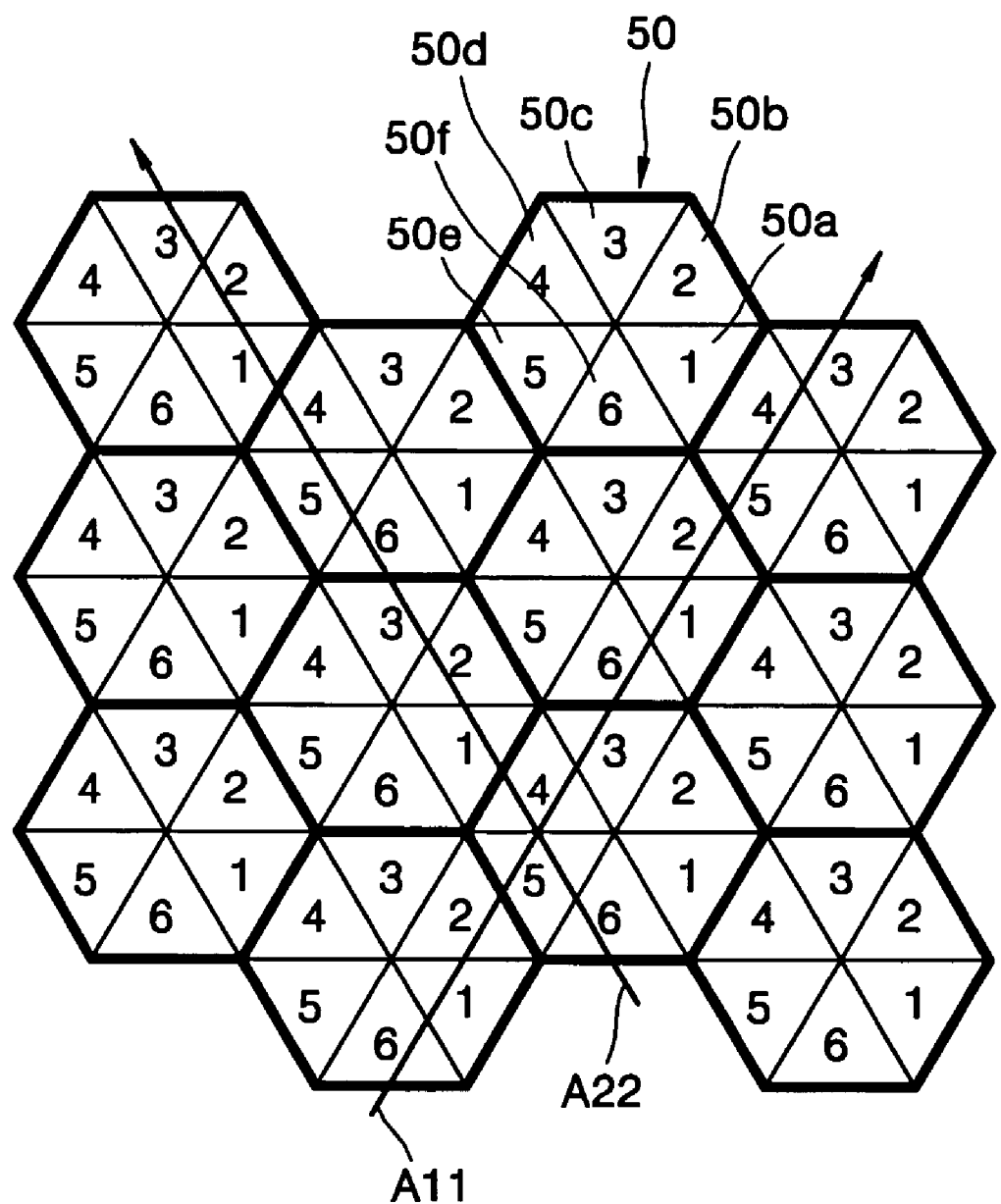

In more detail, referring to FIG. 5, a first pixel 50 includes first through sixth sub-pixels 50a, 50b, 50c, 50d, 50e, and 50f arranged in the counter-clockwise direction. However, the sub-pixels 50a through 50f may be arranged in the clockwise direction. The first through sixth sub-pixels 50a, 50b, 50c, 50d, 50e, and 50f may represent colors that can be combined to represent white color, for example, red (R), green (G), blue (B), magenta (M), cyan (C), and yellow (Y). The pixels around the first pixel 50 also have the same structure as that of the first pixel 50. Reference numerals 1-6 in FIG. 5 denote R, G, B, M, C, and Y colors, respectively.

As described above, since the first pixel 50 includes six sub-pixels and the sub-pixels represent different colors from each other, the sub-pixels of the first pixel 50 and the adjacent sub-pixels of other pixels represent different colors from each other.

In addition, the adjacent sub-pixels arranged in certain directions, for example, along a first line A11 and a second line A22 in FIG. 5 represent different colors from each other.

Thus, a flat panel display apparatus having the pixel structure of FIG. 5 can represent the white color or the gray color in any direction, and thus, the color fringe error is not generated. In addition, since the six sub-pixels forming one pixel represent different colors from each other, the color representation range of the flat display apparatus having the pixel structure of FIG. 5 can be much larger than that of the conventional art.

Embodiment 3

According to the pixel structure of the third embodiment, each pixel includes a plurality of sub-pixels representing different colors from each other and each sub-pixel is formed as a hexagon.

Figure 6:
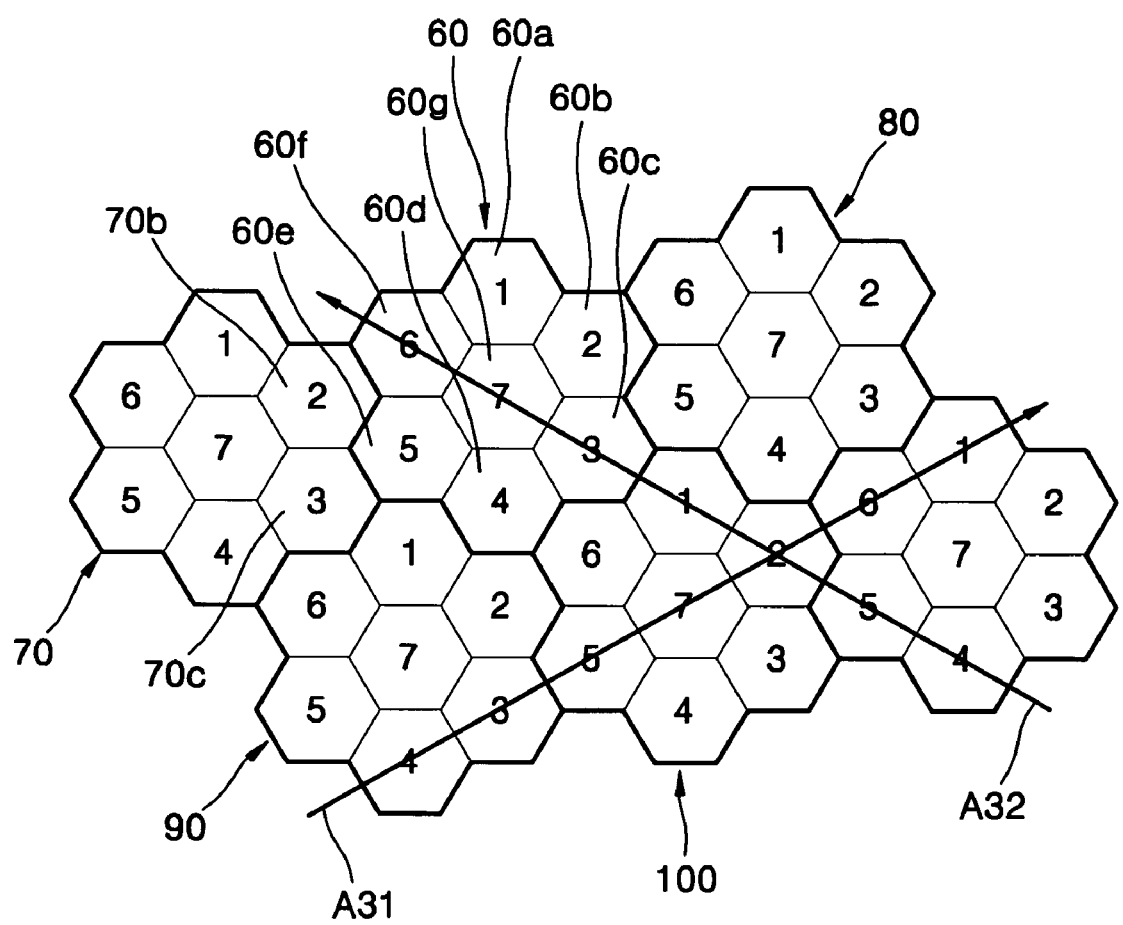

Referring to FIG. 6, a first pixel 60 includes respective first through seventh sub-pixels 60a, 60b, 60c, 60d, 60e, 60f, and 60g. The seventh sub-pixel 60g is located in the center of the first pixel 60, and the first through seventh sub-pixels 60a, 60b, 60c, 60d, 60e, 60f, and 60g are formed as hexagons. Therefore, the first pixel 60 is formed as a polygon with 18 sides, unlike the first pixels 40 and 50 according to the first and second embodiments. The first through seventh sub-pixels 60a, 60b, 60c, 60d, 60e, 60f, and 60g represent colors that can be combined to represent the white color, for example, R, G, B, M, C, Y, and white color.

The first through sixth sub-pixels 60a, 60b, 60c, 60d, 60e, 60f, and 60f forming a boundary of the first pixel 60 represent different colors from each other, and second through fifth pixels 70, 80, 90, and 100 arranged around the first pixel 60 have the same sub-pixels arrangement as that of the first pixel 60. Therefore, an arbitrary sub-pixel of the first pixel 60 and an adjacent sub-pixel of a neighboring pixel represent different colors from each other.

For example, the fifth sub-pixel 60e of the first pixel 60 represents the C color, however, the second and third sub-pixels 70b and 70c of the second pixel 70 adjacent to the fifth sub-pixel 60e represent the G and B colors, respectively.

In addition, the adjacent sub-pixels arranged in a certain direction, for example, along first line A31 and a second line A32 slanted at different angles from each other represent different colors from each other, and seven consecutive sub-pixels represent different colors from each other.

Thus, a flat panel display apparatus having the pixel structure of FIG. 6 is free from the color fringe error. In addition, since one pixel includes seven sub-pixels representing different colors from each other, the color representation range of the apparatus can be much wider than that of the conventional art.

As described above, a pixel is formed as a hexagon including six sub-pixels or a polygon with 18 sides and seven sub-pixels. In the pixel including the six sub-pixels, the sub-pixels may have a rotational symmetric structure or not.

When the sub-pixels have the rotational symmetric structure, each of the six sub-pixels respectively represents one of three primary colors, and the sub-pixels are arranged sequentially in a counter-clockwise direction or clockwise direction. When the sub-pixels do not have the rotational symmetric structure, the six sub-pixels represent different color each other. In the pixel including seven sub-pixels, the sub-pixels are formed as hexagons and represent different colors from each other.

Accordingly, in both cases, two adjacent sub-pixels of different pixels inevitably represent different colors from each other. That is, these cannot exist two adjacent sub-pixels representing the same color due to the geometrical structure of the pixel and the arrangement of the pixels.

Therefore, a flat panel display apparatus including the pixel structure according to the above-described embodiments of the present invention can be free from the color fringe error. Also since one pixel can include six or more primary colors, the color representation range of the flat panel display apparatus is much wider than that of the conventional art. In addition, since the sub-pixels of the pixel can be controlled by sub-pixel rendering, the resolution of the flat panel display apparatus can be improved. Moreover, high resolution can be obtained in every direction of the display due to the superior rotational symmetry between the pixels.

Although a few embodiments of the present invention have been shown and described, the present invention is not limited to the described embodiments. Instead, it would be appreciated by those skilled in the art that changes may be made to these embodiments without departing from the principles and spirit of the invention, the scope of which is defined by the claims and their equivalents.

What is claimed is:

1. A pixel structure for a flat panel display apparatus displaying images using a plurality of pixels, each of the pixels comprising six or more sub-pixels, wherein each of the sub-pixels is a triangle, each of the sub-pixels representing one of three primary colors, and the sub-pixels being arranged so the color represented by a first one of the sub-pixels is different from the color represented by a second one of the sub-pixels adjacent to the first sub-pixel.

2. The pixel structure of claim 1, wherein each of the pixels is a hexagon.

3. The pixel structure of claim 1, wherein the first pixel and the second pixel have rotational symmetry.

4. The pixel structure of claim 3, wherein the first pixel and the second pixel have a rotational symmetry of 60° with respect to each other.

5. The pixel structure of claim 1, wherein the first pixel has the same sub-pixel arrangement as the second pixel.

6. The pixel structure of claim 5, wherein each of the pixels comprises six of the sub-pixels, and the six sub-pixels represent different colors from each other.

7. A pixel structure for a flat panel display apparatus displaying images using a plurality of pixels, each of the pixels comprising six or more sub-pixels, wherein each of the pixels includes seven sub-pixels and each of the seven sub-pixels is a hexagon and the sub-pixels being arranged so that a color represented by a first one of the sub-pixels is different from the color represented by a second one of the sub-pixels adjacent to the first sub-pixel.

8. The pixel structure of claim 7, wherein the seven sub-pixels are arranged such that six sub-pixels surround one of the sub-pixels.

9. The pixel structure of claim 8, wherein the pixel is a polygon with 18 sides.

10. The pixel structure of claim 8, wherein the six sub-pixels can be combined to represent white and the sub-pixel surrounded by the six sub-pixels represents white.

11. The pixel structure of claim 7, wherein the seven sub-pixels represent different colors from each other.

12. A flat panel display displaying images using a plurality of pixels, comprising a pixel structure in which each of the pixels comprises six or more sub-pixels, wherein each of the sub-pixels is a triangle, each of the sub-pixels representing one of three primary colors, and the sub-pixels being arranged so the color represented by a first one of the sub-pixels is different from the color represented by a second one of the sub-pixels adjacent to the first sub-pixel.

13. A flat panel display displaying images using a plurality of pixels, comprising a pixel structure in which each of the pixels includes seven sub-pixels and each of the seven sub-pixels is a hexagon and the sub-pixels being arranged so that a color represented by a first one of the sub-pixels is different from the color represented by a second one of the sub-pixels adjacent to the first sub-pixel.

14. The pixel structure of claim 7, wherein the sub-pixels are arranged so that each of the pixels has 18 sides.

* * * * *

UNITED STATES PATENT AND TRADEMARK OFFICE
CERTIFICATE OF CORRECTION

| | |
|---|---|
| PATENT NO. | : 7,990,496 B2 |
| APPLICATION NO. | : 11/186757 |
| DATED | : August 2, 2011 |
| INVENTOR(S) | : Youngshin Kwak et al. |

It is certified that error appears in the above-identified patent and that said Letters Patent is hereby corrected as shown below:

Title Page Column 1 (Inventors), Line 4, Delete "Balatonalmadl" and insert -- Balatonalmadi --, therefor.

Signed and Sealed this
Twenty-eighth Day of February, 2012

David J. Kappos
*Director of the United States Patent and Trademark Office*